United States Patent
Simon-Boisson

(10) Patent No.: US 9,337,608 B2
(45) Date of Patent: May 10, 2016

(54) LASER SOURCE HAVING A PEAK POWER OF MORE THAN 100 TERAWATTS AND HIGH CONTRAST

(71) Applicant: THALES, Neuilly-sur-Seine (FR)

(72) Inventor: Christophe Simon-Boisson, Boulogne-Billancourt (FR)

(73) Assignee: Thales, Courbevoie (FR)

( * ) Notice: Subject to any disclaimer, the term of this patent is extended or adjusted under 35 U.S.C. 154(b) by 0 days.

(21) Appl. No.: 14/369,702

(22) PCT Filed: Dec. 10, 2012

(86) PCT No.: PCT/EP2012/074890
§ 371 (c)(1),
(2) Date: Jun. 29, 2014

(87) PCT Pub. No.: WO2013/098058
PCT Pub. Date: Jul. 4, 2013

(65) Prior Publication Data
US 2015/0010027 A1    Jan. 8, 2015

(30) Foreign Application Priority Data
Dec. 30, 2011    (FR) ..................... 11 04151

(51) Int. Cl.
*H01S 3/10* (2006.01)
*G02F 1/39* (2006.01)
(Continued)

(52) U.S. Cl.
CPC .............. *H01S 3/10061* (2013.01); *G02F 1/39* (2013.01); *H01S 3/0057* (2013.01);
(Continued)

(58) Field of Classification Search
CPC ....... H01S 3/0057; H01S 3/031; H01S 3/036; H01S 3/063; H01S 3/2316; H01S 2301/02; H01S 3/10023
See application file for complete search history.

(56) References Cited

U.S. PATENT DOCUMENTS 7,430,351 B2    9/2008 Albert et al.
2003/0012236 A1*    1/2003 Hasson .................... 372/25
(Continued)

FOREIGN PATENT DOCUMENTS

EP    1662306 B1    5/2006
FR    2930851 A1    11/2009

OTHER PUBLICATIONS

Yamakawa, "100-TW sub-20-fs Ti:sapphire laser system operating at a 10-Hz repetition rate", Sep. 1998, Optics Letters, vol. 23, No. 18, pp. 1468-1470.*
(Continued)

*Primary Examiner* — Yuanda Zhang
*Assistant Examiner* — Michael Carter
(74) *Attorney, Agent, or Firm* — Baker & Hostetler LLP

(57) ABSTRACT

A laser source capable of emitting energy pulses greater than or equal to 100 TeraWatt, consisting of a laser chain that comprises in cascade: a solid-state laser oscillator; a first amplification stage with frequency chirping; and a last amplification stage with frequency chirping; a first filter with one or two non-linear crystals and third order non-linear optical susceptibility, capable of generating a cross-polarized wave, known as non-linear cross-polarization filter, inserted between these two amplification stages. The laser chain furthermore comprises: between the first and the last amplification stage, at least one other non-linear cross-polarization filter, i.e. N filters in the chain with N≥2; and N−1 dispersion compensator(s), placed at the output of the first filter(s) (respectively).

6 Claims, 2 Drawing Sheets

(51) Int. Cl.
*H01S 3/00* (2006.01)
*H01S 3/23* (2006.01)
*H01S 5/50* (2006.01)
*G02F 1/355* (2006.01)

(52) U.S. Cl.
CPC .......... *H01S 3/10023* (2013.01); *H01S 3/2316* (2013.01); *H01S 5/5036* (2013.01); *G02F 1/3551* (2013.01); *G02F 2001/392* (2013.01); *G02F 2201/16* (2013.01); *H01S 2301/02* (2013.01)

(56) References Cited

U.S. PATENT DOCUMENTS

| | | | |
|---|---|---|---|
| 2005/0265407 A1* | 12/2005 | Braun et al. | 372/30 |
| 2009/0279167 A1 | 11/2009 | Vigroux et al. | |

OTHER PUBLICATIONS

Yanovsky, "Ultra-high intensity 300-TW laser at 0.1 Hz repetition rate," Jan. 2008, Optics Express, vol. 16, No. 3, pp. 2109-2114.*

L. P. Ramirez et al., "Efficient cross polarized wave generation for compact, energy-scable, ultrashort laser sources", Optics Express, Jan. 3, 2011, pp. 93-98, vol. 19, No. 1, 2010 Optical Society of America.

Zhao-Hua Wang et al., "Optimization of contrast ratio and focusable intensity in 700TW femtosecond Ti:sapphire laser facility", Journal of Physics: Conference Series, Institute of Physics Publishing, Bristol GB, Sep. 16, 2010, p. 32012 (1-4), vol. 244, No. 3, 2010 IOP Publishing Ltd.

Julia M. Mikhailova et al., "Ultra-high-contrast few-cycle pulses for multipetawatt-class laser technology", Optics Letters, Aug. 15, 2011, pp. 3145-3147, vol. 36, No. 16, 2011 Optical Society of America.

Ramirez et al., "High Efficient XPW Generation for High Contrast High Energy Ultrashort Laser Pulses", European Quantum Electronics Conference, Lasers and Electro-Optics Europe, May 2011, 1 page.

Cotelet al., "Nonlinear Temporal Pulse Cleaning of a 1-μm Optical Parametric Chirped-Pulse Amplification System", Applied Physics B: Lasers and Optics, Apr. 2006, vol. 83, No. 1, pp. 7-10.

Antonucci et al., "14-fs High Temporal Quality Injector for Ultra-High Intensity Laser", Optics Communications, 2009, vol. 282, pp. 1374-1379.

Tóth et al., "Contrast Enhancement of the LOASIS CPA Laser and Effects on Electron Beam Performance of LWFA", Aip Conference Proceedings, Jan. 2009, pp. 270-272.

Jullien et al., "10-10 Temporal Contrast for Femtosecond Ultraintense Lasers by Cross-Polarized Wave Generation", Optics Letters, Apr. 2005, vol. 30, No. 8, pp. 920-922.

Jullien et al., "High-Fidelity Front-End for High-Power, High Temporal Quality Few-Cycle Lasers", Applied Physics B: Lasers and Optics, Mar. 2011, vol. 102, No. 4, pp. 769-774.

* cited by examiner

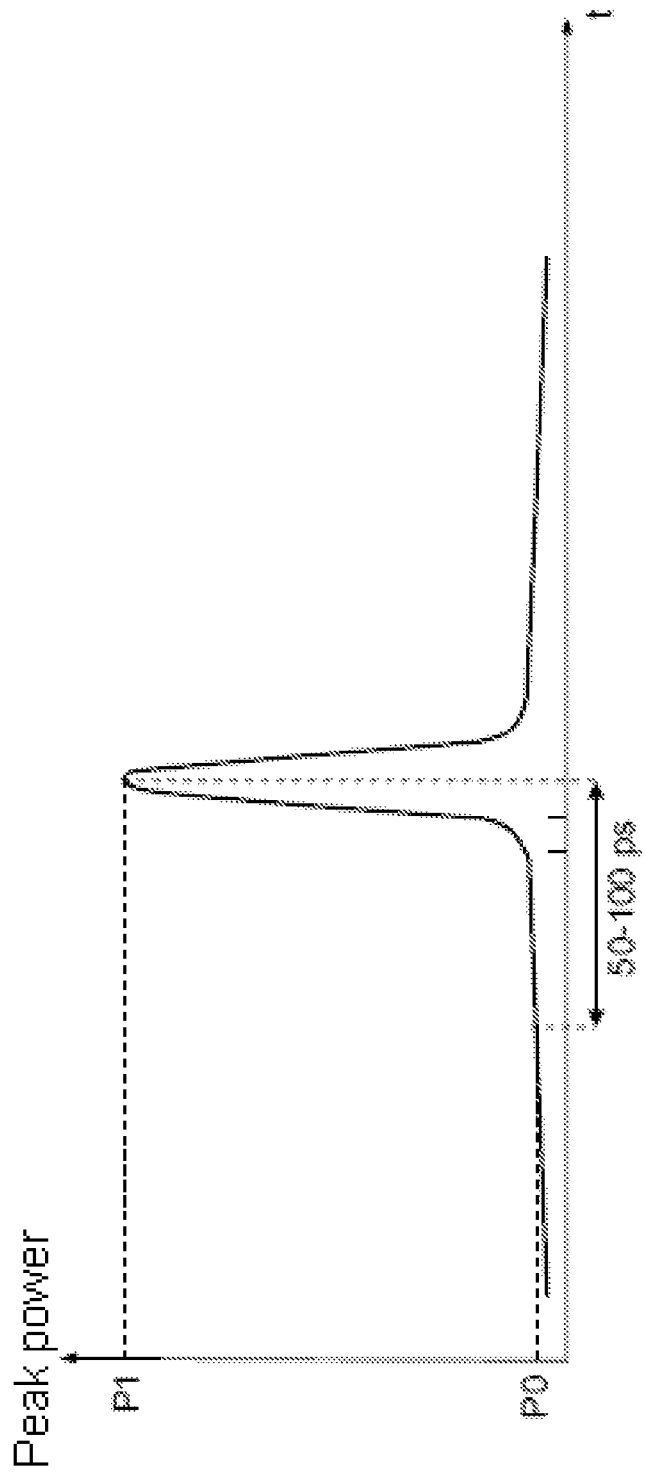

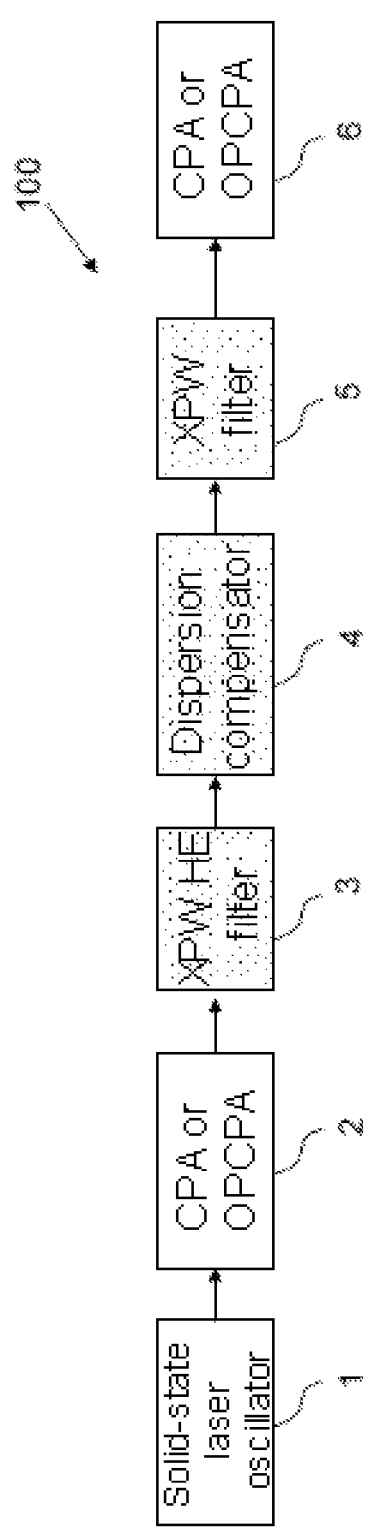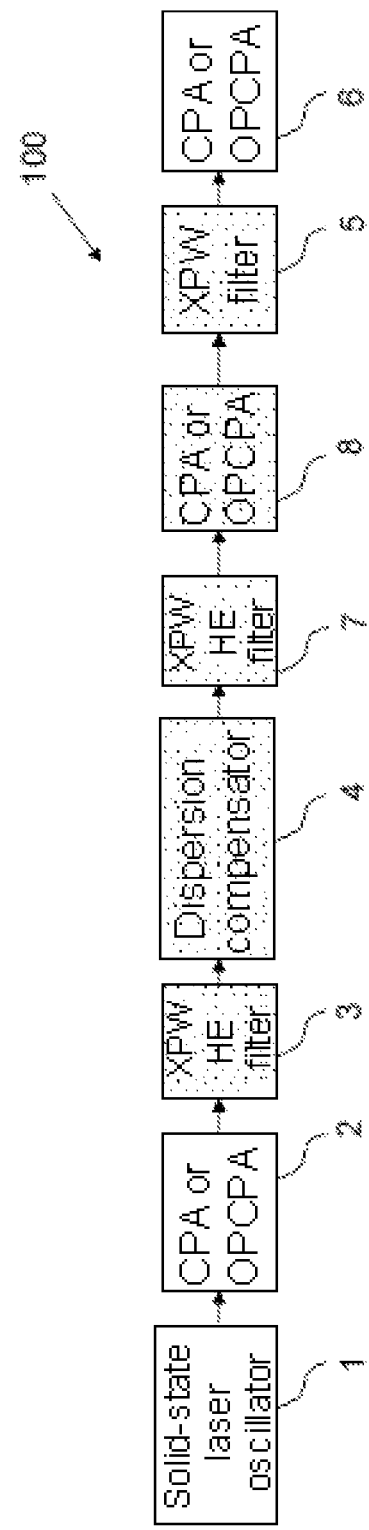

LASER SOURCE HAVING A PEAK POWER OF MORE THAN 100 TERAWATTS AND HIGH CONTRAST

CROSS-REFERENCE TO RELATED APPLICATIONS

This application is a National Stage of International patent application PCT/EP2012/074890, filed on Dec. 10, 2012, which claims priority to foreign French patent application No. FR 1104151, filed on Dec. 30, 2011, the disclosures of which are incorporated by reference in their entirety.

FIELD OF THE INVENTION

The field of the invention is that of lasers with pulses of very high peak power, from at least 100 TeraWatt to a few tens of PetaWatt and even more. At this level of peak power, the pulses are generally ultra-short i.e. of a duration below 200 femtoseconds.

BACKGROUND

Such laser sources are in particular used for laser-material interactions consisting for example in accelerating particles (protons, electrons, ions) or in generating secondary radiation in the region of far-UVs, X- or γ-rays. The pulses are focused on a generally solid target with the aim, for example, of creating a plasma at the surface of the latter.

These laser sources with very high peak power are essentially based on solid-state laser source technologies and the principle of chirped pulse amplification, whether this involves amplification by laser effect, or "CPA", the acronym for the expression Chirped Pulse Amplification, or amplification by non-linear optical effect such as the amplification of parametric fluorescence or "OPCPA", the acronym of the expression Optical Parametric Chirped Pulse Amplification.

From the moment that lasers with very high peak powers are used, it is necessary to pay a great deal of attention to the problem of temporal contrast of the pulses. Indeed, given the multiple-amplifier configurations of these laser sources with high peak power, there always remains a residual light signal generated by the amplification of the spontaneous emission (or "ASE") in the case of laser amplification (CPA) or by the amplification of the parametric fluorescence in the case of parametric amplification (OPCPA). This parasitic signal shown in FIG. 1 has a much larger temporal width than the main pulse; it typically exists during the pumping pulses, which generally have pulse durations of about a few nanoseconds. And most importantly, it is already present before the main pulse. The temporal contrast is the ratio between the peak power P1 of the main pulse and the peak power P0 of the ASE pulse; the target values and the measurements for P0 are generally situated in a time interval between 50 and 100 picoseconds before the main pulse, in such a way as to remove other effects such as imperfect compression. The problem is the same if the ratio is very high, in the case of a main pulse of very high peak power, the ASE pulse will still have a significant peak power. If one considers the case of a main pulse of 1 PetaWatt with a temporal contrast of $10^9$:1 (P1/P0=$10^9$), the ASE will have a peak power of 1 MegaWatt, enough in the case of focusing on a target, to create a plasma on the latter (notably if it is solid) before the arrival of the main pulse which is disastrous for the intended applications.

It is therefore necessary to optimize the temporal contrast of the pulses, knowing that to obtain satisfactory results with any solid material forming the target, it is necessary to aim for temporal contrasts with respect to the ASE of the order of $10^{12}$:1 for a laser of 1 petawatt and of $10^{13}$:1 for a laser of 10 petawatts.

Until now, the technologies used to increase the temporal contrast are:
- the addition of a saturable absorber, or
- the implementation of a non-linear filter based on the technology of generating a cross-polarized wave in a non-linear crystal, subsequently denoted by "XPW" for Cross-Polarized Wave, or
- the use of plasma mirrors.

A saturable absorber is very simple to implement but its contribution is limited because it does not make it possible to improve the contrast of the pulses by more than one or two orders of magnitude. This is mainly due to the fact that the laser damage threshold of these materials are relatively low.

The XPW filter technique was demonstrated for the first time in a laser chain with high peak power in 2004. The architecture of a XPW filter is relatively simple but its efficiency is not very high (at the output a maximum of 30% of the energy of the input pulse is obtained) and the theoretical increase in contrast (output contrast=cube of the input contrast) is heavily limited by the extinction ratios of the polarizers used, which means that the net gain is only of 4 to 5 orders of magnitude, which is still clearly better than the saturable absorber. A XPW filter includes two polarizers and one or two non-linear crystals between the two polarizers.

Plasma mirror technology has been used for a few years now to improve the contrast of laser chains with high peak power. The principle is based on the use of the beam at the output of the chain, therefore after the final temporal compression. The beam is focused on a transparent medium; the ASE pulse is therefore transmitted but from the start of the main pulse there is enough intensity to create a plasma at the surface of the transparent material. This plasma is reflective, thus forming a plasma mirror, and it will reflect around 70% of the main pulse which will be "rid" of a large part of the ASE pulse which will have been transmitted before the creation of the plasma. However, it will be necessary to repeat the operation a second time to obtain an increase in the contrast of around 4 to 5 orders of magnitude. This main pulse, reflected twice, is then focused on the target.

This technology has several drawbacks. The energy loss is therefore of the order of 50% and it is definitive since there are no further amplifiers afterwards, unlike in the case of the XPW filters. Moreover, this technology is relatively complex to implement. Firstly, the assembly of the device is under vacuum since it involves a compressed beam and the assembly is quite bulky given the size of the beam. Secondly, it is obviously necessary, after each shot, to move the plasma mirrors since the light spot of the focused laser has produced a highly reflective plasma but has also locally produced irreversible damage to the optical surface. This therefore entails the installation of precise motorized parts that are compatible with the vacuum.

To obtain temporal contrasts of the order of $10^{11}$:1 or even of $10^{12}$:1 for a solid target, at the minimum a few tens of picoseconds before the main pulse, none of these techniques considered stand-alone is sufficient and it will therefore be necessary to combine them. Due to this fact, given the relatively small contribution of saturable absorber technology to the improvement of contrast, a combination of the saturable absorber with one of the two other techniques cannot suffice insofar as the "natural" contrast at the start of the laser chain before the use of these devices is of the order of $10^5$ to $10^6$:1. It is therefore necessary to combine a XPW filter and a double plasma mirror, to obtain the required level of contrast, knowing that the latter device has the aforementioned drawbacks.

As a consequence, there remains to this day a need for a system simultaneously satisfying all the aforementioned requirements in terms of peak power, temporal contrast, energy, and simplicity of implementation.

SUMMARY OF THE INVENTION

The basic idea of the invention is to associate at least two XPW filters in order to improve the contrast by 7 to 8 orders of magnitude with an extremely simple, low cost and entirely passive device, i.e. one without parts to move or replace. Compensation for the dispersion introduced by the first XPW filter, i.e. by the propagation through the non-linear crystals and the polarizers, is achieved by means of an intermediate compressor in such a way as to produce a pulse with optimized characteristics (duration and spectral phase) at the input of the second XPW filter.

More precisely, the subject of the invention is a laser source capable of emitting energy pulses greater than or equal to 100 TeraWatt, consisting of a laser chain that comprises, in cascade:
- a solid-state laser oscillator,
- a first and a last amplification stage with frequency chirping, each including in cascade a stretcher, an amplifying chain and a compressor,
- a first filter with one or two non-linear crystals and third order non-linear optical susceptibility, capable of generating a cross-polarized wave, known as non-linear cross-polarization filter, inserted between these two amplification stages.

It is mainly characterized in that the laser chain comprises between the first and the last amplification stage, at least one other non-linear cross-polarization filter, i.e. N filters in the laser chain with N≥2 and N−1 dispersion compensator(s), placed at the output of the first filter(s) (respectively).

It optionally comprises a third amplification stage with frequency chirping inserted between two non-linear cross-polarization filters, this third amplification stage including in cascade a stretcher, an amplifying chain and a compressor, this compressor also being a dispersion compensator.

A dispersion compensator can be a mirror compressor with controlled dispersion.

An amplification stage is typically a CPA or an OPCPA amplifier.

BRIEF DESCRIPTION OF THE DRAWINGS

Other characteristics and advantages of the invention will become apparent upon reading the following detailed description, given by way of non-limiting example and with reference to the appended drawings wherein:

FIG. 1 schematically shows the peak power of a main pulse and of the ASE as a function of time, FIG. 2 schematically represents a first example of a laser source according to a first embodiment of the invention, FIG. 3 schematically represents a second example of a laser source according to the invention.

DETAILED DESCRIPTION

The basic idea of the proposed solution is to combine at least two XPW filters in order to improve the contrast of the pulses by 7 to 8 orders of magnitude.

More precisely, the laser source 100 according to the invention, an example of which is shown in FIG. 2, comprises in cascade in a basic configuration:
- a solid-state laser oscillator 1,
- a first CPA or OPCPA amplification stage 2 with frequency chirping, at the output of which the contrast is of the order of $10^5$ or $10^6$,
- a first XPW filter 3, preferably a XPW HE filter,
- a dispersion compensator 4 including for example a pair of mirrors with controlled dispersion,
- another XPW filter 5,
- a last CPA or OPCPA amplification stage 6 with frequency chirping, at the output of which the contrast is of the order of $10^{12}$ or $10^{13}$.

It will be recalled that an amplifier with frequency chirping includes in cascade a stretcher, an amplifying chain with one or more amplifiers, and a compressor. In each amplifier, there are one or more passes of the laser beam.

A XPW filter includes one or two non-linear crystals with third order non-linear optical susceptibility and two polarizers. Among the XPW filters used in the context of this invention, mention may be made of the filters described in U.S. Pat. No. 1,662,306. This can for example be the XPW filter comprising a first polarizer P1 which makes it possible to obtain a field E with rectilinear polarization from the pulse at the input of the filter. This field is focused on a cubic crystal C i.e. one not having any offset in group velocity between the incident field and the generated field, such as a $BaF_2$ crystal which is furthermore transparent over a large spectral region, from the ultraviolet to the infrared. The field E can be focused outside the crystal C but near the latter. This crystal C converts part of the incident field into a field E'1 with rectilinear polarization, orthogonal to that of E. Another part of the incident field is transmitted by the crystal C without being converted: this unconverted field, of same polarization as the incident field, is the carrier of the ASE.

According to a first embodiment, the filter includes a second crystal with cubic geometry capable of receiving at the input the field E'1 and the residual field E and of generating from this residual field E a field E'2 of same polarization as E'1 and with the same temporal properties, and therefore capable of producing constructive interferences with the field E'1.

According to another embodiment, the crystal C suffices to generate this field E'2 in a multi-pass configuration.

A second polarizer P2 with rectilinear polarization orthogonal to that of P1 makes it possible to attenuate or even to remove the field carrying the ASE, to only let through the field E'1+E'2 i.e. that of the main pulse.

As indicated previously, the first of these filters 3 is preferably a XPW HE (High Energy) filter, thus named because it is capable of receiving pulses with an input energy lying between 0.5 mJ and 15 mJ, thanks to a configuration in which the size of the beam on the crystal(s) is compatible with this level of energy. An example of such a configuration is described in "Efficient cross polarized wave generation for compact, energy-scalable, ultrashort laser sources", Ramirez & al., Optics Express, Vol. 19, Issue 1, pp. 93-98 (2011). The second filter 5 is a XPW HE filter or a conventional XPW filter as described above, the input energy of which lies between 0.1 and 0.5 mJ.

Insofar as the first filter 3 introduces some dispersion induced by the propagation of the beam through the polarizers and the non-linear crystal(s) where the XPW effect takes place, it is imperative to compensate for this dispersion in such a way as to present a beam with optimal characteristics on the second (other) XPW filter 5. Given the relatively low value of this dispersion, the compensation is produced by means of a compressor 4 with mirrors with controlled dispersion (generally a pair of mirrors), which are components currently available commercially and whose dispersion characteristics can be adjusted depending on the compensation to be produced.

There can be a dispersion compensator after the second XPW filter 5, but not necessarily insofar as the beam is stretched immediately afterwards and not insofar as the compensation can be produced by means of adjustments of the compressor of the last amplification stage 6 with frequency chirping.

XPW filters exist which in terms of admissible input energy (up to 15 mJ) make such a combination possible: indeed, if for example the first XPW filter receives an energy of 3 mJ and has an efficiency of 15%, it procures a beam of 450 µJ which given the losses, notably those of the compressor whose mirrors have controlled dispersion, makes it possible to have access to 300 µJ at the input of the second XPW filter. When this second filter has an efficiency of 20%, it makes it possible to deliver an energy of 60 µJ for the injection of the second amplification stage with frequency chirping, i.e. a perfectly adequate value and one that is easily at the level of the prior art.

The problem of complexity is thus solved, because the XPW stages are very simple, consisting of a few crystals and a few optical components, the dimensions of which remain small because the energies involved are weak at this place in the chain.

The first filter 3 is optionally placed in a vacuum, taking the incident energy into account, but it is a vacuum chamber including only the non-linear crystal(s) and a spatial filtering device, i.e. typically a cylinder of 5 cm in diameter and of 50 cm in length, and therefore a much less voluminous chamber than in the case of the plasma mirrors of the order of one $m^3$; moreover the required level of vacuum is much lower than in the case of the plasma mirrors (of the order of 2 orders of magnitude lower).

The second problem incurred by the double plasma mirror, that of energy loss, is here again solved because, since XPW filters are placed at the start of the laser chain, to compensate for the significant loss that they introduce (the total transmission is only of a few %), it suffices to add one or two passes from the first multi-pass amplifier of the second amplification stage with frequency chirping.

A preferred means of embodiment consists in the following architecture using the base configuration, with in cascade:
- a titanium-sapphire oscillator 1 with mode locking,
- a first titanium-sapphire CPA 2 typically delivering 3 mJ, at the output of which the contrast is of the order of $10^5$ or $10^6$,
- a XPW HE filter 3 with one crystal of BaF2 with a 15% efficiency for example,
- a dispersion compensator 4 equipped with a pair of mirrors with controlled dispersion, with overall transmission of the order of 70%,
- a XPW filter 5 with two crystals of BaF2 with a 20% efficiency, with a typical input energy of 300 µJ and a typical output energy of 60 µJ,
- a second titanium-sapphire CPA 6 delivering a peak power typically comprised between 100 TW and 30 PW according to the number of amplifiers of this CPA.

Many variants are possible:
- the BaF2 can be replaced by CaF2 or SrF2 or CaBaF2, or CaSrF2 or diamond or LiF or YAG or any other material with third order non-linear susceptibility capable of generating a cross-polarized wave,
- the CPAs can be replaced by OPCPAs or it is possible to have a hybrid configuration (OPCPA then CPA),
- for a CPA, the amplifying medium can be Titanium-doped sapphire, glass (or a mixture) of Neodymium- or Ytterbium-doped glass(es), or ytterbium-doped glass or crystals,
- the filter 5 can be a XPW HE filter,
- it is possible to envision a configuration with three XPW filters (two XPW HE filters then one XPW filter for example) inserted between the two amplification stages with frequency chirping, with a dispersion compensator after each of the two first XPW filters; in this case, it is possible to envision an increase in the contrast of 10 to 12 orders of magnitude compatible with an exawatt peak power,
- it is possible to envision a configuration with three amplification stages with frequency chirping (CPA or OPCPA) as shown in FIG. 3, with one or two XPW filters (or XPW HE filters) between two amplification stages (between the first one 2 and the middle one 8, or between the middle one 8 and the last one 6; in the example in the figure, there are two filters 3, 7 between the amplification stages 2 and 8), with a dispersion compensator after each of the first XPW filters, knowing that this third amplification stage 8 can play, via its compressor, the part of a dispersion compensator and thus replace one compensator. When the laser chain includes N filters (N≥2 and including the first filter), there is a dispersion compensator at the output of the N−1 first filters, i.e. N−1 compensators.

The invention can have another advantage, which is that of an increase in the spectral widening inherent in XPW technology. Indeed, a XPW stage produces a widening of the spectrum by a factor of √3 (and therefore a reduction of the pulse duration by as much) because the non-linear phenomenon is dependent on the cube of the intensity. The implementation of two XPW stages is therefore of a kind to produce a widening of the spectrum by a factor of three. This reduction in the duration of each pulse makes it possible to reduce the pumping energy. Amplification stages with frequency chirping of CPA type are then preferably used.

The invention claimed is:

1. A laser source configured to emit energy pulses greater than or equal to 100 TeraWatt having a pulse duration below 200 femtoseconds, comprising a laser chain that comprises, in cascade:
    a solid-state laser oscillator,
    a first amplification stage with frequency chirping, and
    a last amplification stage with frequency chirping, the first and the last amplification stages each including, in cascade, a stretcher, an amplifying chain and a compressor,
    a first filter configured as a non-linear cross-polarization filter, with one or two non-linear crystals and a third order non-linear optical susceptibility, configured to generate a cross-polarized wave, and wherein said one or two non-linear crystals are placed between two polarizers,
    wherein the first filter is inserted between the first and the last amplification stage, wherein the laser chain comprises:
    between the first and the last amplification stage, at least one additional filter also configured as a non-linear cross-polarization filter to obtain a temporal contrast of the pulses greater than or equal to $10^{12}$ between an input pulse provided to the laser source and an output pulse at an output of the laser source, such that N filters are in the laser chain with N≥2, and N−1 dispersion compensator(s), each placed respectively at an output of the first filter in the laser chain.

2. The laser source as claimed in claim 1, wherein the laser chain comprises a third amplification stage with frequency chirping inserted between the first filter and the at least one additional filter, this third amplification stage including in cascade a stretcher, an amplifying chain and a compressor, the compressor being another dispersion compensator.

3. The laser source as claimed in claim 1, wherein at least one dispersion compensator is a mirror compressor with controlled dispersion.

4. The laser source as claimed in claim 1, wherein one or more amplification stages is a CPA or an OPCPA amplifier.

5. The laser source as claimed in claim 4, wherein a CPA amplifier has an amplifying medium that is Titanium-doped sapphire or glass or a mixture of Neodymium- or Ytterbium-doped glasses or Ytterbium-doped crystals.

6. The laser source as claimed in claim 1, wherein the non-linear crystal is a $BaF_2$ crystal.

* * * * *